(12) United States Patent
Senba et al.

(10) Patent No.: US 7,566,965 B2
(45) Date of Patent: Jul. 28, 2009

(54) SEMICONDUCTOR MODULE

(75) Inventors: Takehiko Senba, Saitama (JP);
Katsuhiro Sasaki, Miyagi (JP); Takeshi Misawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 322 days.

(21) Appl. No.: 11/449,824

(22) Filed: Jun. 9, 2006

(65) Prior Publication Data
US 2006/0281231 A1    Dec. 14, 2006

(30) Foreign Application Priority Data
Jun. 10, 2005 (JP) .............................. 2005-171341

(51) Int. Cl.
*H01L 23/10* (2006.01)
(52) U.S. Cl. .................. 257/710; 257/682; 257/433
(58) Field of Classification Search ................ 257/682, 257/659, 704, 729, 710, 433
See application file for complete search history.

(56) References Cited
U.S. PATENT DOCUMENTS
6,483,324 B1 * 11/2002 Mitter et al. ................ 324/689

| 2003/0056392 A1 * | 3/2003 | Boroson et al. ............... 34/335 |
| 2003/0062186 A1 * | 4/2003 | Boroson et al. ............. 174/52.2 |
| 2003/0143423 A1 * | 7/2003 | McCormick et al. ........ 428/690 |
| 2003/0203551 A1 * | 10/2003 | Cok et al. .................... 438/200 |
| 2003/0211644 A1 * | 11/2003 | Boroson et al. ............... 438/26 |
| 2006/0022592 A1 * | 2/2006 | Boroson ..................... 313/512 |

FOREIGN PATENT DOCUMENTS

JP    2004-331920 A    11/2004

* cited by examiner

*Primary Examiner*—S. V Clark
(74) *Attorney, Agent, or Firm*—Sughrue Mion, PLLC

(57) ABSTRACT

An image sensor module is composed of a base, a CCD image sensor, a glass plate, and a frame-shaped moisture permeable member. The base has a depressed chip chamber, in which the CCD image sensor is contained. Top and under surfaces of the moisture permeable member are provided with adhesive layers. The base and the glass plate are attached above and below the moisture permeable member through the adhesive layers, and the chip chamber is sealed. The moisture permeable member has the property to block liquid water while transmit water vapor, and releases the water vapor produced by the heat of the CCD image sensor from the inside to the outside of the chip chamber.

17 Claims, 2 Drawing Sheets

SEMICONDUCTOR MODULE

BACKGROUND OF THE INVENTION

1. Field of the Invention

The present invention relates to a semiconductor module with a semiconductor chip contained in a package, and more particularly to the semiconductor module capable of preventing dew condensation in the package.

2. Description Related to the Prior Art

Digital cameras and Camera phones are provided with image sensor modules. The image sensor module has a package which contains an image sensor chip so as to protect a light receiving surface of the image sensor chip from dusts. Generally, the package is made of either plastic, metals, or ceramic, and the plastic is often used in these days because of ease of process and low cost.

The package has a package body and a cover. Formed in the package body is a chip chamber, in which the image sensor is contained. The transparent cover is placed on the package body and bonded thereto with an adhesive agent such as an epoxy resin. In this manner, the chip chamber is sealed for the protection from dusts.

The semiconductor chips such as the image sensors are often made of an epoxy resin because of cost concerns. The epoxy resin, nevertheless, absorbs moisture when left in a damp place for a long time, and sometimes causes dew condensation in the chip chamber that contains the semiconductor chip. The Japanese patent laid-open publication No. 2004-331920 then discloses the semiconductor chip package made of a waterproof, low water absorption material.

Even with such waterproof package, however, if water vapor happens to be trapped in the chip chamber when the semiconductor chip is sealed, there is no method for releasing the water vapor from the chip chamber. As a result, when the ambient temperature goes lower than the temperature inside the chip chamber, dew condensation occurs in the chip chamber. In this case, the dew drops may fall on the semiconductor chip and cause a short circuit in the semiconductor chip. Furthermore, if the semiconductor chip is the image sensor chip, a light receiving surface of the image sensor may have the dew condensation, and the quality of images may therefore be degraded.

SUMMARY OF THE INVENTION

In view of the foregoing, an object of the present invention is to provide a semiconductor module capable of preventing dew condensation in a chip chamber.

To achieve the above and other objects, the semiconductor module according to the present invention is provided with a frame-shaped moisture permeable member attached to a top surface of a package body. The package body has a depressed chip chamber for containing a semiconductor chip, and the moisture permeable member encloses this chip chamber. A cover is then attached to the top surface of the moisture permeable member, so that the chip chamber is sealed tightly. Preferably, the moisture permeable member is made of a high polymer material having a lot of pores.

The semiconductor chip can be an image sensor chip that has a light receiving surface. In this case, the cover is made of a transparent material.

According to the semiconductor module of the present invention, the water vapor inside the chip chamber is released to the outside through the moisture permeable member. Dew condensation in the chip chamber is therefore prevented, and so does a short circuit of the semiconductor chip. A simple structure that has the moisture permeable member inserted between the package body and the cover enables the package to release the water vapor to the outside. It is also possible, if the semiconductor chip is the image sensor chip, to prevent the dew condensation on the light receiving surface. Therefore, the high image quality can be maintained.

BRIEF DESCRIPTION OF THE DRAWINGS

For more complete understanding of the present invention, and the advantage thereof, reference is now made to the following descriptions taken in conjunction with the accompanying drawings, in which.

DESCRIPTION OF THE PREFFERED EMBODIMENTS

Figure 1:
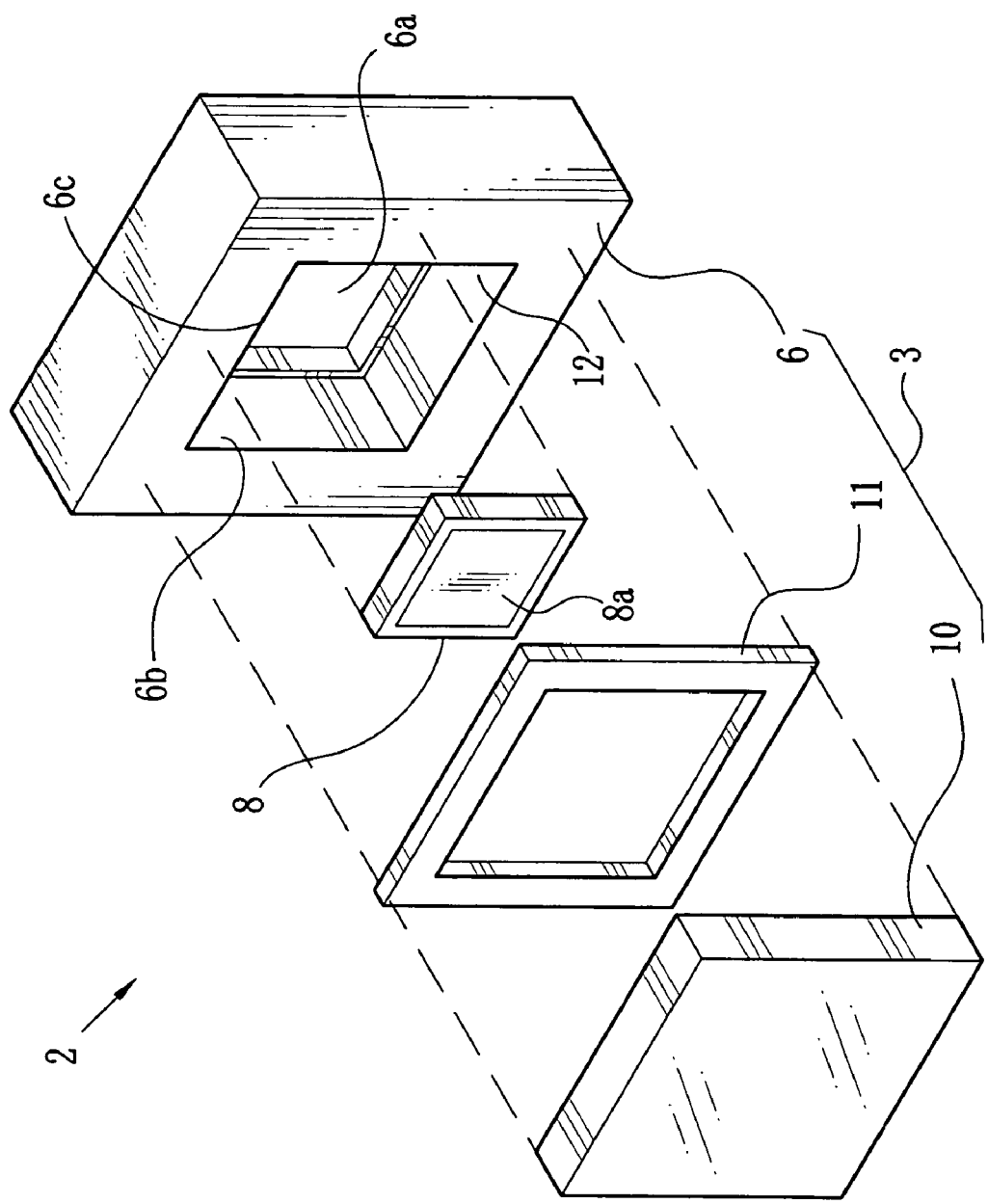
FIG. 1 is an exploded perspective view of an image sensor module according to the present invention.

Referring to FIG. 1, an image sensor module 2, i.e. a semiconductor module, includes a package 3 and a CCD image sensor 8 that is a semiconductor chip. The package 3 is composed of a base 6 as a package body, a glass plate 10 as a cover, and a moisture permeable member 11. The base 6 has a depressed chip chamber 12 defined by a mounting area 6a to which the CCD image sensor 8 is attached, a surrounding wall 6b that surrounds the mounting area 6a, and an opening 6c. The CCD image sensor 8 has a light receiving surface 8a. The moisture permeable member 11 is formed into a frame shape whose inner periphery is almost the same size as the opening 6c, and attached on the base 6 to enclose the opening 6c. On a top surface of the moisture permeable member 11, the glass plate 10 is attached. Incidentally, the base 6 is made of either an epoxy resin, a plastic resin such as a polyimide resin, or ceramic.

Figure 2:
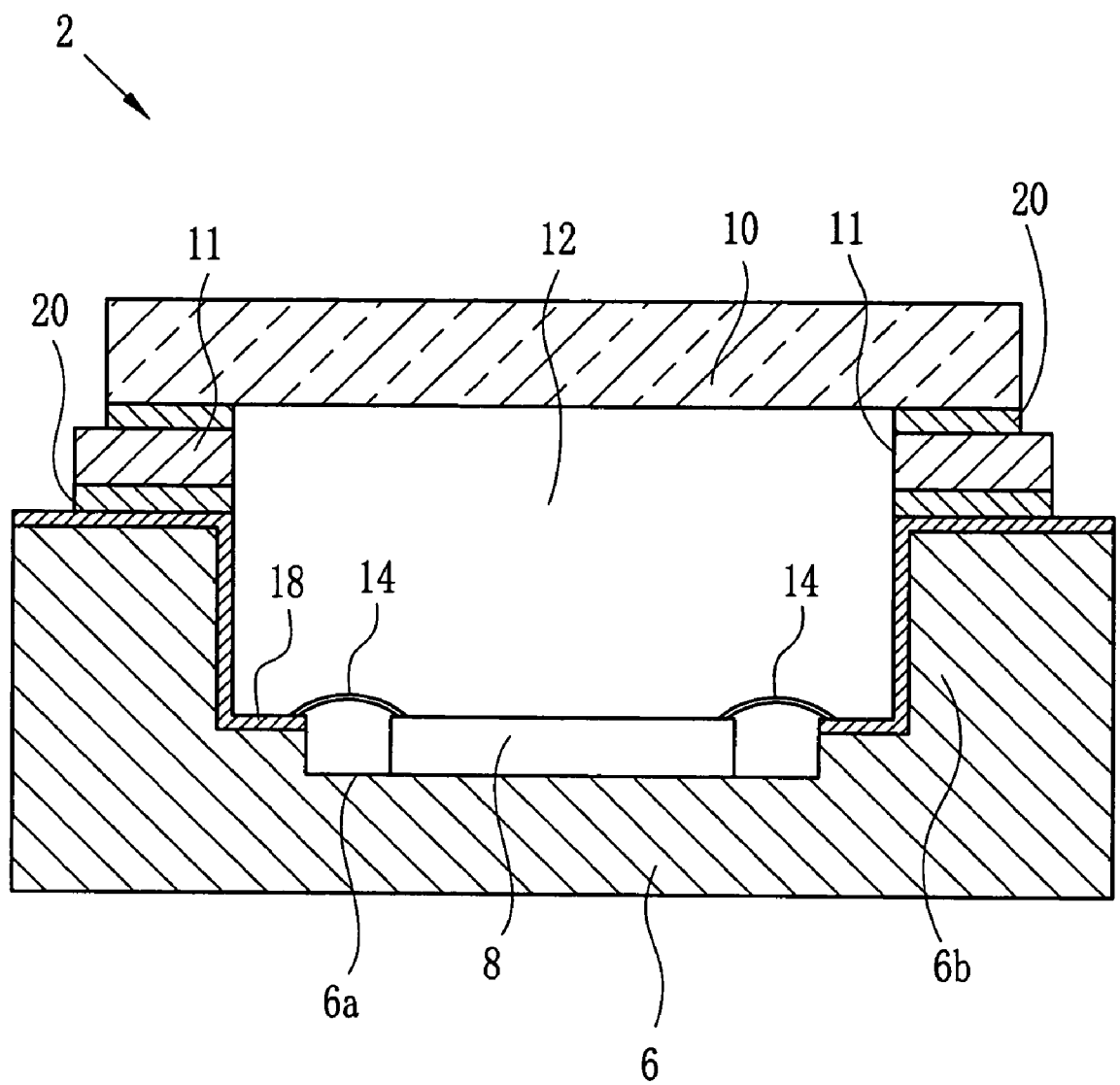
FIG. 2 is a cross sectional view of the image sensor module.

As shown in FIG. 2, the transparent glass plate 10 transmits light that goes to the light receiving surface 8a of the CCD image sensor 8. Disposed around the light receiving surface 8a are plural electrodes (not shown), which output the electric signals which the CCD image sensor 8 generates relative to the intensity of incident light. The base 6 is provided with a wiring layer 18, whose one end is connected to the electrodes of the CCD image sensor 8 through bonding wires 14. The other end of the wiring layer 18 is exposed on the top surface of the base 6, and connected through a lead wire to a signal processing circuit that processes the output signals of the CCD image sensor 8.

Between the base 6 and the glass plate 10, the moisture permeable member 11 is inserted tightly. The moisture permeable member 11 is formed of a high polymer material having a lot of pores, which block liquid water (liquid) and transmit water vapor (gas). On the top and under surfaces of the moisture permeable member 11, adhesive layers 20 are provided. The base 6 and the glass plate 10 are attached to the moisture permeable member 11 through the adhesive layers 20, and thereby the chip chamber 12 is sealed. The inside surface of the moisture permeable member 11 is exposed in the chip chamber 12, while the outside surface thereof is exposed outside the image sensor module 2. This structure allows the water vapor in the chip chamber 12 to be released to the outside. Accordingly, neither the CCD image sensor 8 nor the glass plate 10 has dew condensation, and the high image quality is maintained. Preferably, the moisture permeable member 11 is made of Gore-Tex (registered trademark) or ENTRANT (registered trademark).

The operation of the present invention is now described. Firstly, the CCD image sensor 8 is placed in the chip chamber 12. Then, the electrodes of the CCD image sensor 8 are connected to the wiring layer 18 of the base 6 through the bonding wires 14, and the glass plate 10 is attached to the base 6 through the moisture permeable member 11. The moisture permeable member 11 is made of the Gore-Tex, and allows the passage of water vapor from the chip chamber 12 to the outside. Therefore, the chip chamber 12 hardly has the dew condensation even when, for example, the ambient temperature is lower than the temperature inside the chip chamber 12.

Although the semiconductor chip is the image sensor chip in the above embodiment, the semiconductor chip is not limited to this. The semiconductor chip may have transistors or thyristors formed therein, for example.

In the above embodiment, the moisture permeable member 11 is formed into a frame shape and attached around the opening 6c through the adhesive layer 20. Instead of this structure, it is possible to incorporate the moisture permeable member into a part of the surrounding wall of the chip chamber. This constitution also ensures adequate release of the water vapor from the chip chamber, and the dew condensation is prevented.

As described so far, the present invention is not to be limited to the above embodiments, and all matter contained herein is illustrative and does not limit the scope of the present invention. Thus, obvious modifications may be made within the spirit and scope of the appended claims.

What is claimed is:

1. A semiconductor module comprising:
   a semiconductor chip;
   a package body with a depressed chip chamber in which said semiconductor chip is contained;
   a moisture permeable member attached to a top surface of said package body and enclosing said chip chamber, said moisture permeable member allows passage of water vapor from inside to outside of said chip chamber; and
   a cover attached to a top surface of said moisture permeable member and sealing said chip chamber,
   wherein said moisture permeable member is formed into a frame shape, and
   said moisture permeable member is made of a high polymer material having a plurality of pores which block liquid water and transmit said water vapor.

2. A semiconductor module as claimed in claim 1, wherein said semiconductor chip is an image sensor chip for converting incident light into electric signals and wherein said cover is made of a transparent material.

3. A semiconductor module as claimed in claim 1, wherein said moisture permeable member is formed into a frame shape defining an opening within said moisture permeable member such that a plane of said moisture permeable member does not overlap a plane of said semiconductor chip.

4. A semiconductor module as claimed in claim 3, wherein said plane of said moisture permeable member does not overlap with a plane of a light receiving surface of said semiconductor chip.

5. A semiconductor module as claimed in claim 3, further comprising an adhesive layer having a frame shape and disposed on an edge portion of said cover and said adhesive layer attaches said moisture permeable member to said edge portion of said cover.

6. A semiconductor module as claimed in claim 5, wherein said adhesive layer substantially overlaps and adheres to said top surface of said moisture permeable member.

7. A semiconductor module as claimed in claim 3, wherein said package body includes a wall which surrounds said semiconductor chip and said moisture permeable member is attached to a top surface of the wall of said package body.

8. A semiconductor module as claimed in claim 1, further comprising an adhesive layer having a frame shape and disposed on an edge portion said cover and said adhesive layer attaching said moisture permeable member to said edge portion of said cover.

9. A semiconductor module as claimed in claim 1, wherein said moisture permeable member is formed into a frame shape which defines an opening and said moisture permeable member is attached to said cover such that a plane of said opening of said moisture permeable member overlaps an entire upper surface of said semiconductor chip.

10. A semiconductor module as claimed in claim 1, wherein said moisture permeable member allows passage of water vapor to flow from the inside of said chip chamber to the outside of said chip chamber.

11. A semiconductor module as claimed in claim 10, wherein water vapor flows from inside said semiconductor module to outside said semiconductor module through said moisture permeable member.

12. A semiconductor module as claimed in claim 1, wherein water vapor flows from inside said semiconductor module to outside said semiconductor module through said moisture permeable member.

13. A semiconductor module as claimed in claim 1, wherein said package body includes a wall which surrounds said semiconductor chip and said moisture permeable member is included within said wall such that water vapor exits said chip chamber by passing from the inside said chip chamber to the outside of said chip chamber.

14. A semiconductor module as claimed in claim 1, wherein said frame shape is a four sided structure and defines an opening therein.

15. A semiconductor module as claimed in claim 1, wherein said moisture permeable member allows passage of water vapor to flow from the inside of said chip chamber to the outside of said chip chamber through said plurality of pores, while blocking liquid water.

16. A semiconductor module as claimed in claim 1, wherein said moisture permeable member is made of substantially porous material.

17. A semiconductor module as claimed in claim 1, wherein said chip chamber is an enclosure formed by said package body, said moisture permeable member, and said cover and forms an air cavity around said semiconductor chip.

* * * * *